United States Patent
Yeong et al.

(10) Patent No.: US 10,868,151 B2
(45) Date of Patent: *Dec. 15, 2020

(54) CONFORMAL TRANSFER DOPING METHOD FOR FIN-LIKE FIELD EFFECT TRANSISTOR

(71) Applicant: Taiwan Semiconductor Manufacturing Co., Ltd., Hsinchu (TW)

(72) Inventors: Sai-Hooi Yeong, Hsinchu County (TW); Sheng-Chen Wang, Hsinchu County (TW); Bo-Yu Lai, Taipei (TW); Ziwei Fang, Hsinchu (TW); Feng-Cheng Yang, Hsinchu County (TW); Yen-Ming Chen, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/396,961

(22) Filed: Apr. 29, 2019

(65) Prior Publication Data

US 2019/0252527 A1 Aug. 15, 2019

Related U.S. Application Data

(63) Continuation of application No. 15/653,720, filed on Jul. 19, 2017, now Pat. No. 10,276,691.

(Continued)

(51) Int. Cl.
*H01L 21/265* (2006.01)
*H01L 29/66* (2006.01)
(Continued)

(52) U.S. Cl.
CPC ...... *H01L 29/66803* (2013.01); *H01L 21/225* (2013.01); *H01L 21/26526* (2013.01); *H01L 29/165* (2013.01); *H01L 29/66818* (2013.01)

(58) Field of Classification Search
CPC ....... H01L 21/26526; H01L 21/22–228; H01L 21/2236; H01L 21/823431;
(Continued)

(56) References Cited

U.S. PATENT DOCUMENTS 8,598,025 B2 12/2013 Steen et al.
8,722,520 B2 5/2014 van Dal
(Continued)

FOREIGN PATENT DOCUMENTS

KR 20150060935 6/2015
KR 20160136292 11/2016
(Continued)

OTHER PUBLICATIONS

"Momentum Transfer Implantation for Sidewall Doping of FinFET's" by G. Fuse et al. In Extended Abstracts of the 2010 International Conference on Solid State Devices and Materials, Tokyo, 2010, pp. 229-230 (Year: 2010).*

*Primary Examiner* — Eric A. Ward
(74) *Attorney, Agent, or Firm* — Haynes and Boone, LLP

(57) ABSTRACT

Doping techniques for fin-like field effect transistors (FinFETs) are disclosed herein. An exemplary method includes forming a fin structure, forming a doped amorphous layer over a portion of the fin structure, and performing a knock-on implantation process to drive a dopant from the doped amorphous layer into the portion of the fin structure, thereby forming a doped feature. The doped amorphous layer includes a non-crystalline form of a material. In some implementations, the knock-on implantation process crystallizes at least a portion of the doped amorphous layer, such (Continued)

that the portion of the doped amorphous layer becomes a part of the fin structure. In some implementations, the doped amorphous layer includes amorphous silicon, and the knock-on implantation process crystallizes a portion of the doped amorphous silicon layer.

20 Claims, 9 Drawing Sheets

Related U.S. Application Data

(60) Provisional application No. 62/434,694, filed on Dec. 15, 2016.

(51) Int. Cl.
*H01L 21/225* (2006.01)
*H01L 29/165* (2006.01)

(58) Field of Classification Search
CPC ....... H01L 21/82382; H01L 29/66795–66818; H01L 2029/7857; H01L 2029/7858; H01L 27/0886
See application file for complete search history.

(56) References Cited

U.S. PATENT DOCUMENTS

| | | | |
|---|---|---|---|
| 8,836,016 B2 | 9/2014 | Wu et al. | |
| 8,841,701 B2 | 9/2014 | Lin et al. | |
| 8,846,508 B1 | 9/2014 | England et al. | |
| 8,847,293 B2 | 9/2014 | Lee et al. | |
| 8,853,025 B2 | 10/2014 | Zhang et al. | |
| 8,962,400 B2 | 2/2015 | Tsai et al. | |
| 8,980,719 B2 * | 3/2015 | Tsai | H01L 21/2254 438/306 |
| 9,093,367 B2 | 7/2015 | Liu et al. | |
| 9,093,514 B2 | 7/2015 | Tsai et al. | |
| 9,105,559 B2 | 8/2015 | Basker et al. | |
| 9,236,267 B2 | 1/2016 | De et al. | |
| 9,245,805 B2 | 1/2016 | Yeh et al. | |
| 9,299,564 B2 | 3/2016 | Waite et al. | |
| 9,472,620 B1 | 10/2016 | Wang et al. | |
| 9,520,482 B1 | 12/2016 | Chang et al. | |
| 9,576,814 B2 | 2/2017 | Wu et al. | |
| 10,276,691 B2 * | 4/2019 | Yeong | H01L 21/225 |
| 2011/0195555 A1 | 8/2011 | Tsai et al. | |
| 2012/0112248 A1 | 5/2012 | Wu et al. | |
| 2013/0023104 A1 * | 1/2013 | Isogai | H01L 21/82341 438/306 |
| 2013/0244392 A1 | 9/2013 | Oh et al. | |
| 2014/0073105 A1 | 3/2014 | Isogai | |
| 2014/0120691 A1 | 5/2014 | Lee et al. | |
| 2014/0175543 A1 * | 6/2014 | Glass | H01L 21/82343 257/337 |
| 2016/0218104 A1 | 7/2016 | Wen et al. | |
| 2016/0254186 A1 * | 9/2016 | Leib | H01L 29/41791 257/383 |
| 2017/0069737 A1 | 3/2017 | Choi et al. | |
| 2017/0133377 A1 * | 5/2017 | Glass | H01L 29/66545 |
| 2018/0175175 A1 | 6/2018 | Yeong et al. | |

FOREIGN PATENT DOCUMENTS

| | | |
|---|---|---|
| TW | 201246299 | 11/2012 |
| TW | 201530622 | 8/2015 |
| WO | 2015080945 | 6/2015 |

* cited by examiner

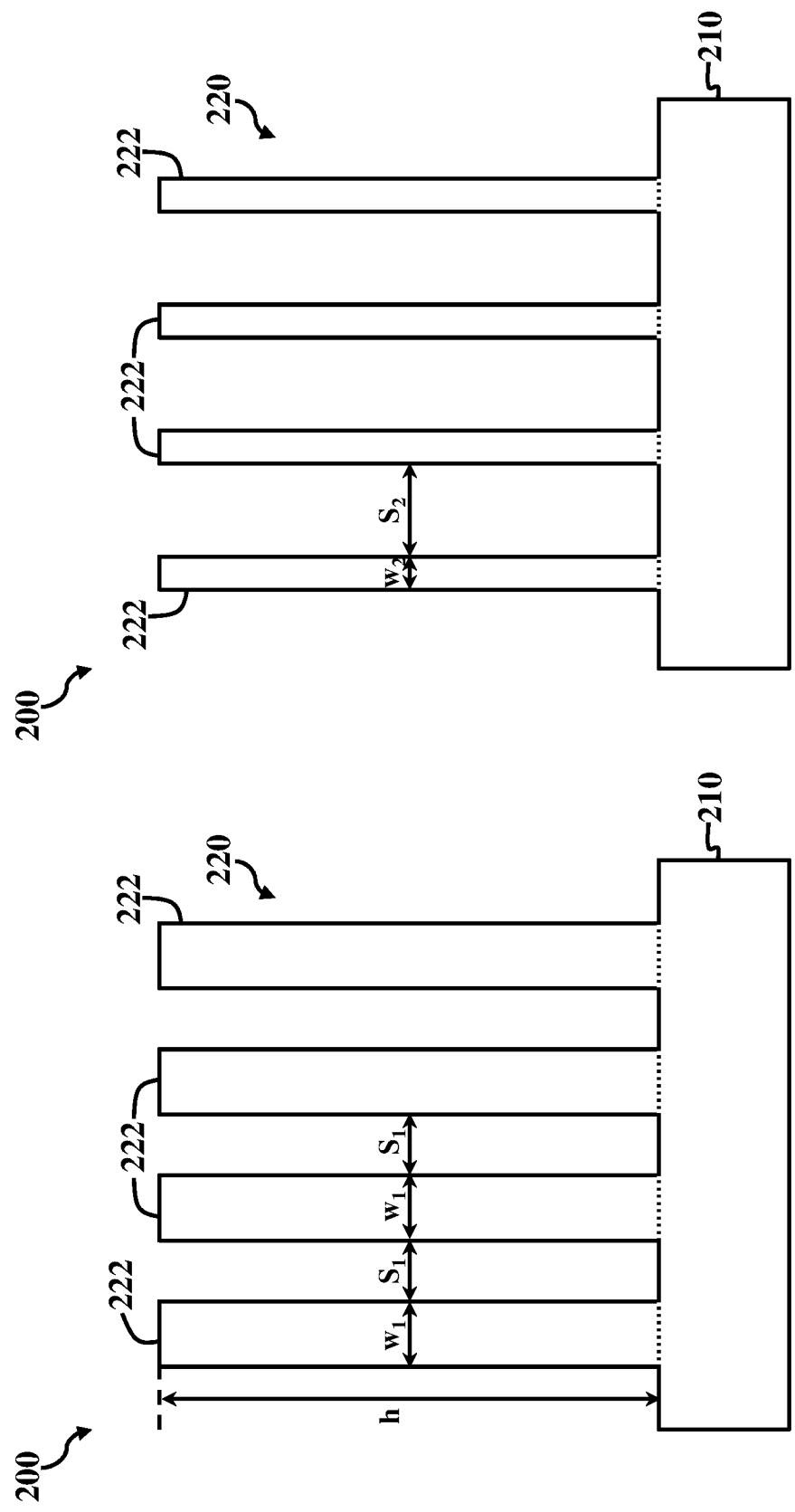

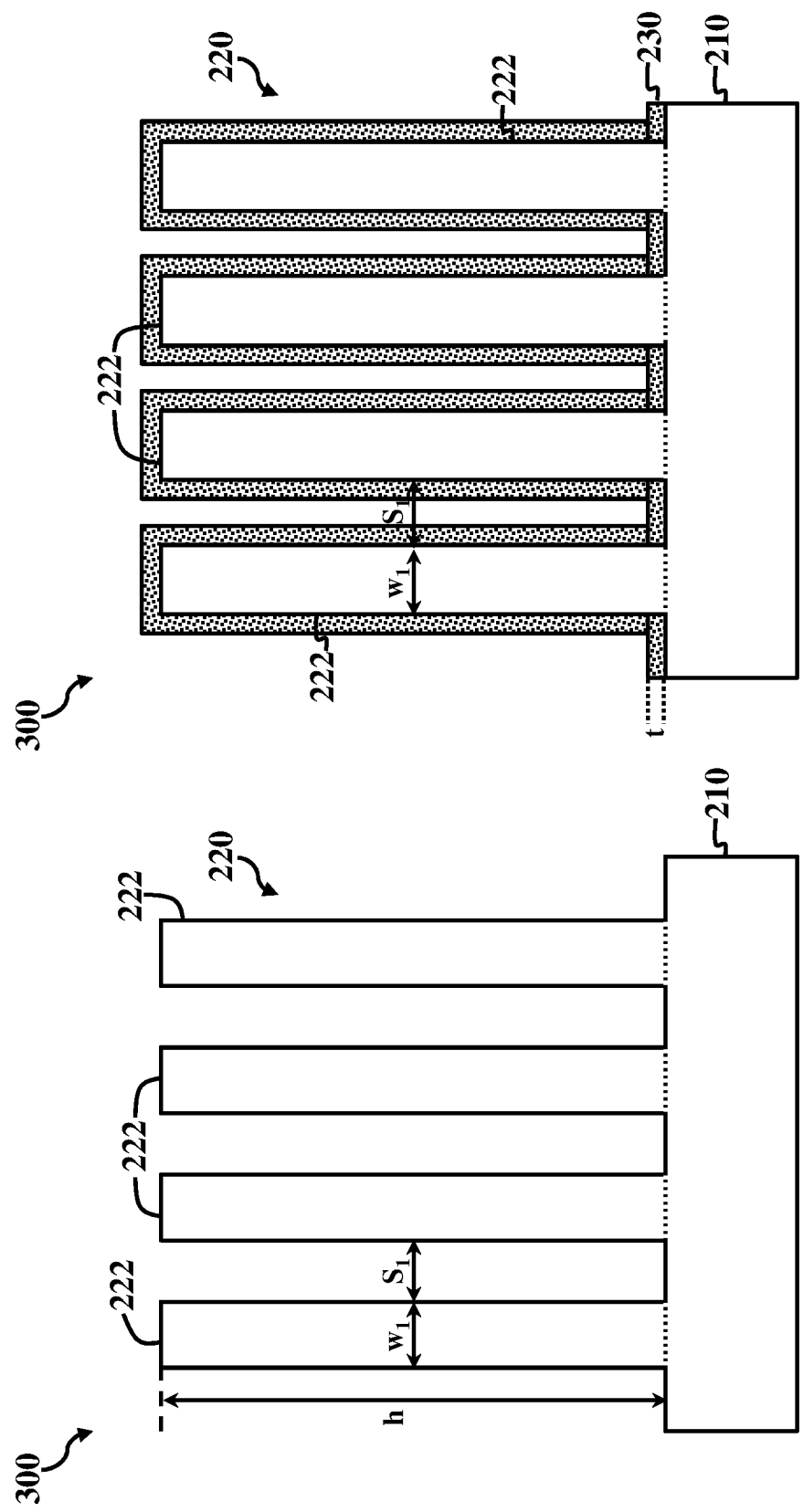

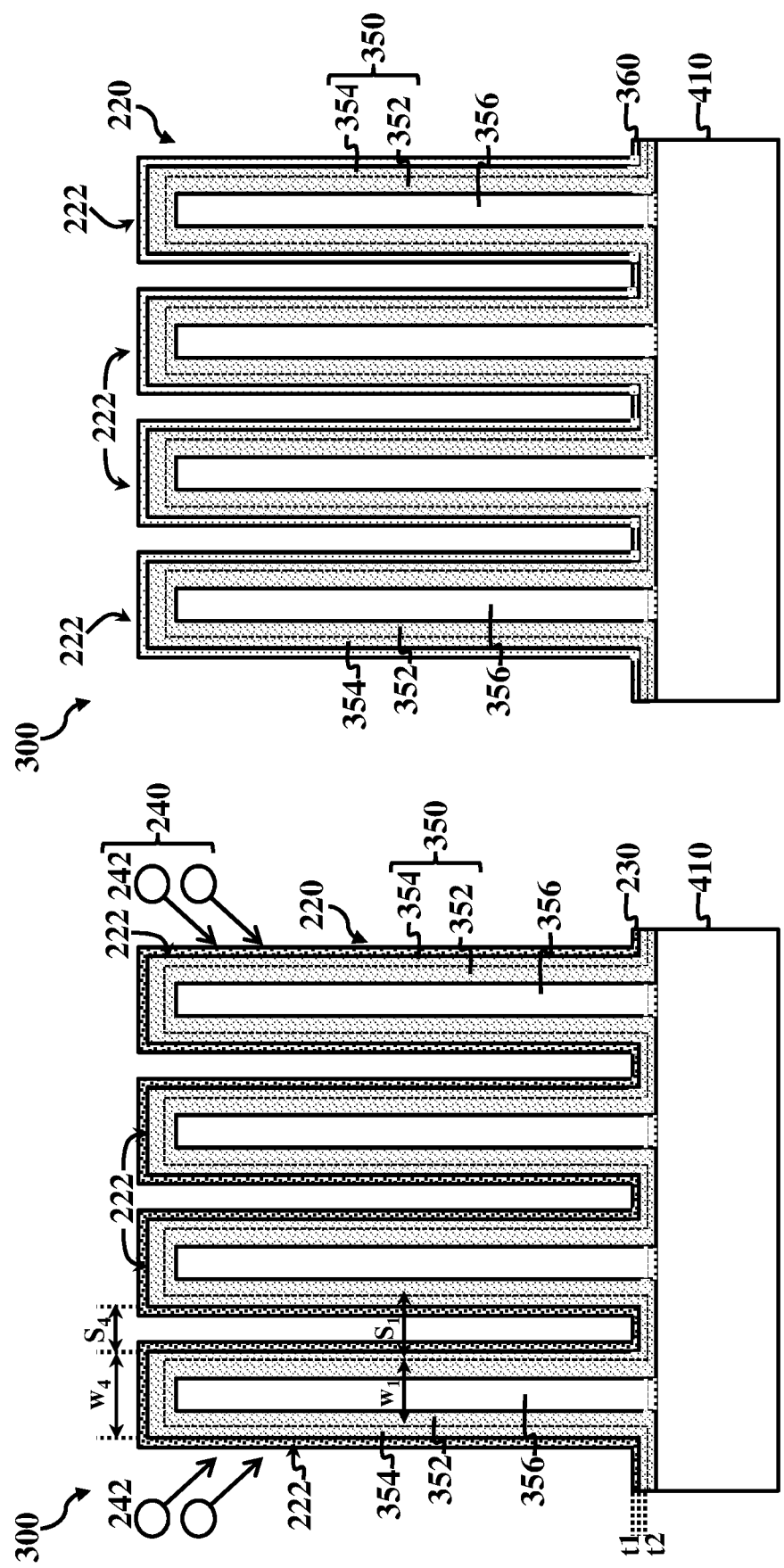

US 10,868,151 B2

CONFORMAL TRANSFER DOPING METHOD FOR FIN-LIKE FIELD EFFECT TRANSISTOR

The present application is a continuation application of U.S. patent application Ser. No. 15/653,720, filed Jul. 19, 2017, which claims benefit of U.S. Provisional Patent Application Ser. No. 62/434,694, filed Dec. 15, 2016, each of which is incorporated herein by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as fin-like field effect transistor (FinFET) technologies progress towards smaller feature sizes (such as 32 nanometers, 28 nanometers, 20 nanometers, and below), advanced doping techniques are needed to provide doped features (regions) in fin structures having deeper, more uniform doping profiles without damaging the fin structures. Although existing FinFET doping techniques have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-2E are fragmentary cross-sectional views of a FinFET device, in portion or entirety, at various fabrication stages, such as those associated with the method of FIG. 1, according to various aspects of the present disclosure.

FIGS. 3A-3E are fragmentary cross-sectional views of another FinFET device, in portion or entirety, at various fabrication stages, such as those associated with the method of FIG. 1, according to various aspects of the present disclosure.

DETAILED DESCRIPTION

Figure 1:
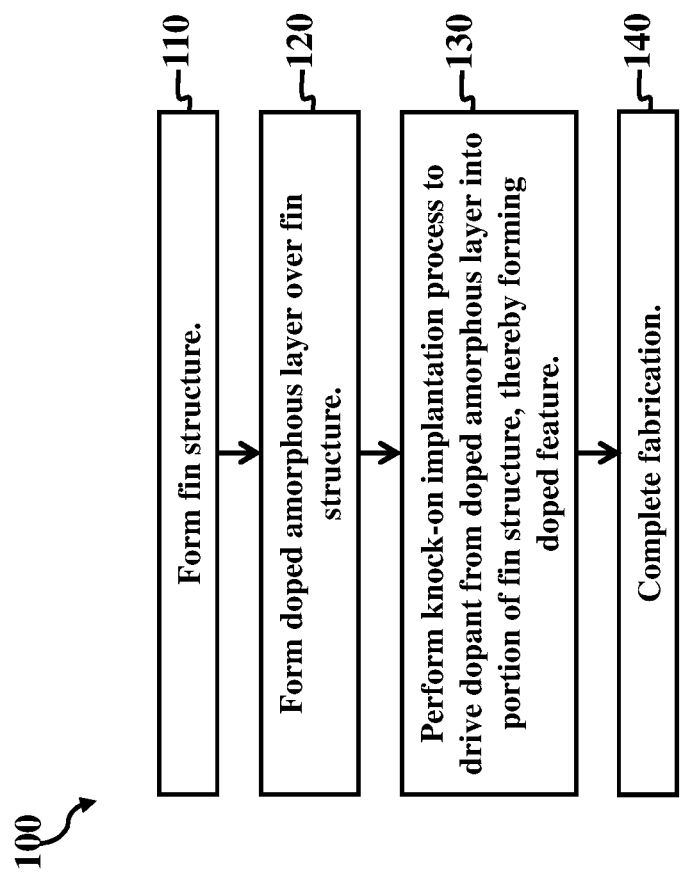
FIG. 1 is a flow chart of a method for fabricating a fin-like field effect transistor (FinFET) device according to various aspects of the present disclosure.

The present disclosure relates generally to integrated circuit devices, and more particularly, to fin-like field effect transistor (FinFET) devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a flow chart of a method 100 for fabricating an integrated circuit device according to various aspects of the present disclosure. In some implementations, as described herein, method 100 fabricates an integrated circuit device that includes a FinFET device. At block 110, method 100 includes forming a fin structure, for example, over a substrate. The fin structure includes a crystalline material (in other words, a material having an ordered atomic structure), such as silicon organized in a crystalline structure. In some implementations, the fin structure includes a channel region disposed between a source region and a drain region.

At block 120, a doped amorphous layer is formed over the fin structure. The doped amorphous layer includes a material having a non-crystalline structure (in other words, a material having a disordered atomic structure). In some implementations, the doped amorphous layer includes the same material as the fin structure, except the material of the doped amorphous layer has a non-crystalline structure. For example, the fin structure includes silicon in a crystalline structure, while the doped amorphous layer includes silicon in a non-crystalline structure, such as amorphous silicon. In some implementations, the doped amorphous layer and the fin structure include different materials. For example, the fin structure includes silicon germanium in a crystalline structure, and the doped amorphous layer includes silicon in a non-crystalline structure, such as amorphous silicon. In some implementations, the doped amorphous layer has a higher dopant concentration than the fin structure. In implementations where the fin structure and the doped amorphous layer include the same material, but different atomic structures, the material of the doped amorphous layer has a higher dopant concentration than the material of the fin structure. In some implementations, the material of the fin structure is undoped. In some implementations, the doped amorphous layer is formed over the source region and the drain region of the fin structure. In such implementations, before forming the doped amorphous layer, a gate structure can be formed over the channel region of the fin structure.

At block 130, a knock-on implantation process is performed to drive dopant from the doped amorphous layer into a portion of the fin structure, thereby forming a doped feature. In some implementations, the doped feature is a lightly doped source and drain feature (or region) disposed in the source region and/or the drain region of the fin structure. In some implementations, the doped feature (or region) is a doped well of the FinFET device, such as a doped well for defining an active region of the FinFET device (in such implementations, the fin structure may be undoped before the knock-on implantation process). The knock-on implantation process causes at least a portion of the doped amorphous layer to become a part of the fin structure. In particular, the knock-on implantation process can convert at least a portion of the non-crystalline material of the doped amorphous layer into crystalline material. The knock-on implantation process can thus order an atomic structure of a portion of the doped amorphous layer. In implementations where the fin structure includes silicon and the doped amorphous layer includes amorphous silicon, the knock-on implantation process crystallizes at least a portion of the amorphous silicon, thereby forming a doped silicon feature (region) of the fin structure that includes a converted (or crystallized) portion of the doped amorphous layer and a doped portion of the fin structure. In implementations where the fin structure includes silicon germanium and the doped amorphous layer includes amorphous silicon, the knock-on implantation process crystallizes at least a portion of the amorphous silicon, thereby forming a doped feature (region) of the fin structure that includes a converted (or crystallized) portion of the doped amorphous layer (for example, in some implementations, a silicon capping layer) and a doped portion of the fin structure.

In implementations where a portion of the doped amorphous layer becomes a part of the fin structure, method 100 can proceed with removing a remaining portion of the doped amorphous layer. In such implementations, removing the remaining portion of the doped amorphous layer can include oxidizing the remaining portion of the doped amorphous layer, and performing a wet etching process and/or a cleaning process to remove the oxidized remaining portion. In some implementations, before forming the doped amorphous layer, a trimming process is performed to reduce a dimension (such as a width) of the fin structure. In such implementations, the knock-on implantation process converts the entire doped amorphous layer into a part of the fin structure (in other words, into crystalline material), such that no portion of the doped amorphous layer remains. Such implementations eliminate the need for any subsequent wet etching process and/or subsequent cleaning process. In some implementations, a thickness of the doped amorphous layer is equal to a thickness (or width) of the fin structure removed during the trimming process.

At block 140, method 100 can continue to complete fabrication of the FinFET device. For example, in implementations where the gate structure includes a dummy gate, a gate replacement process is performed to replace the dummy gate with a metal gate. In implementations where the doped feature defines an active region of the FinFET device, method 100 can proceed with forming additional IC features to fabricate a functional FinFET device. Additional steps can be provided before, during, and after method 100, and some of the steps described can be moved, replaced, or eliminated for additional embodiments of method 100. The discussion that follows illustrates various embodiments of FinFET devices that can be fabricated according to method 100.

FIGS. 2A-2E are fragmentary cross-sectional views of a FinFET device 200, in portion or entirety, at various fabrication stages (such as those associated with method 100) according to various aspects of the present disclosure. FinFET device 200 may be included in a microprocessor, a memory, and/or other integrated circuit device. In some implementations, FinFET device 200 may be a portion of an IC chip, a system on chip (SoC), or portion thereof, that includes various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. FIGS. 2A-2E have been simplified for the sake of clarity to better understand the inventive concepts of the present disclosure. Additional features can be added in FinFET device 200, and some of the features described below can be replaced, modified, or eliminated in other embodiments of FinFET device 200.

In FIG. 2A, FinFET device 200 includes a substrate (wafer) 210. Substrate 210 includes a crystalline material, which generally refers to a material having an ordered atomic structure (often referred to as a crystalline structure). For example, in the depicted embodiment, substrate 210 includes silicon in a crystalline structure. Alternatively or additionally, substrate 210 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 210 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 210 can include various doped regions (not shown) depending on design requirements of FinFET device 200. In some implementations, substrate 210 includes p-type doped regions (for example, p-type wells) doped with p-type dopants, such as boron, indium, other p-type dopant, or combinations thereof. In some implementations, substrate 210 includes n-type doped regions (for example, n-type wells) doped with n-type dopants, such as phosphorus, arsenic, other n-type dopant, or combinations thereof. In some implementations, substrate 210 includes doped regions formed with a combination of p-type dopants and n-type dopants. The various doped regions can be formed directly on and/or in substrate 210, for example, providing a p-well structure, an n-well structure, a dual-well structure, a raised structure, or combinations thereof. An ion implantation process, a diffusion process, and/or other suitable doping process can be performed to form the various doped regions in substrate 210.

A fin structure 220 is formed over substrate 210 using any suitable process. In FIG. 2A, fin structure 220 includes a plurality of fins 222 extending from substrate 210, though the present disclosure contemplates embodiments where fin structure 220 includes a single fin 222 extending from substrate 210. In some implementations, fin structure 220 is a portion of substrate 210 (such as a portion of a material layer of substrate 210). For example, in the depicted embodiment, where substrate 210 includes a crystalline material, fin structure 220 includes the same crystalline material, such as silicon in a crystalline structure. Alternatively, in some implementations, fin structure 220 is defined in a material layer including a semiconductor material in a crystalline structure overlying substrate 210, such as silicon germanium in a crystalline structure. In some implementations, fin structure 220 can include a semiconductor layer stack (for example, a heterostructure) having various semiconductor layers. The semiconductor layers include any suitable material in a crystalline structure, such as silicon, germanium, silicon germanium, other suitable material, or combinations thereof. The semiconductor layers can include same or different materials, etching rates, constituent atomic percentages, constituent weight percentages, thicknesses, and/or configurations depending on design requirements of FinFET device 200.

Each fin 222 has a height h, a width $w_1$ defined by a pair of sidewalls, and a length l defined by a pair of sidewalls (not shown in the depicted view). Adjacent fins 222 are separated by a space $S_1$, where a pitch P of fins 222 generally refers to a sum of a width of a particular fin 222 (such as $w_1$) and a width of a space adjacent to the particular fin 222 (such as $S_1$) (in other words, $P=w_1+S_1$). In some implementations, pitch P is a minimum pitch achievable between fins 222 by a lithography process for a given technology node. In some implementations, height h is about 30 nm to about 80 nm, and width $w_1$ is about 1 nm to about 30 nm. For example, in the depicted embodiment, height h is about 30 nm to about 80 nm, and width $w_1$ is about 2 nm to about 20 nm. In some implementations, space $S_1$ is about 10 nm to about 30 nm. In some implementations, pitch P is about 10 nm to about 50 nm. The present disclosure contemplates variations in height h, width $w_1$, and length l of fins 222 that may arise from processing and fabrication of FinFET device 200. For example, though each fin 222 is depicted as having substantially the same width $w_1$ along height h, in some implementations, width $w_1$ represents an average width of a given fin 222. In some implementations, a width of fins 222 varies from an upper portion of fins 222 to a lower portion of fins 222, where width $w_1$ represents an average of the varying widths. In some implementations, the width tapers from the upper portion of fins 222 to the lower portion of fins 222, such that an average width of the upper portion is less than an average width of the lower portion. In some implementations, width $w_1$ can vary from about 5 nm to about 15 nm along fins 222 depending on where width $w_1$ is measured along height h of fins 222. In some implementations, width $w_1$ of fins 222 varies depending on a position of fins 222 relative to one another and/or relative to other features of FinFET device 200. For example, width $w_1$ of center fins 222 (in the depicted embodiment, FinFET device 200 includes two center fins 222) may be greater than width $w_1$ of edge fins 222 (here, the leftmost fin 222 and the rightmost fin 222, which enclose the two center fins 222). In another example, alternatively, width $w_1$ of center fins 222 is less than width $w_1$ of edge fins 222. In both such implementations, width $w_1$ of edge fins 222 can represent an average width of edge fins 222, and width $w_1$ of center fins 222 can represent an average width of center fins 222.

A combination of deposition, lithography, and/or etching processes are performed to define fins 222 extending from substrate 210 as illustrated in FIG. 2A. For example, forming fin structure 220 includes performing a lithography process to form a patterned resist layer over substrate 210 (or a material layer disposed over substrate 210) and performing an etching process to transfer a pattern defined in the patterned resist layer to substrate 210 (or the material layer disposed over substrate 210). The lithography process can include forming a resist layer on substrate 210 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of substrate 210, where the etching process uses the patterned resist layer as an etch mask. The etching process can include a dry etching process, a wet etching process, other suitable etching process, or combinations thereof. In some implementations, a reactive ion etching (RIE) process is performed. After the etching process, the patterned resist layer is removed from substrate 210, for example, by a resist stripping process. Alternatively, fin structure 220 is formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some implementations, directed self-assembly (DSA) techniques are implemented while forming fin structure 220. Further, in some alternate implementations, the exposure process can implement maskless lithography, electron-beam (e-beam) writing, ion-beam writing, and/or nanoimprint technology for patterning the resist layer.

In FIG. 2B, a trimming process is performed to trim fin structure 220, thereby reducing a dimension of fins 222. For example, the trimming process decreases a width of fins 222, such that fins 222 have a width $w_2$ after the trimming process that is less than width $w_1$. The trimming process also increases spacing between fins 222, such that adjacent fins 222 are separated by a space $S_2$ that is greater than space $S_1$. In some implementations, the trimming process reduces a width of fins 222 about 2 nm to about 20 nm, though the present disclosure the trimming process removing different amounts of fins 222. For example, in some implementations where width $w_1$ is about 5 nm to about 30 nm, the trimming process reduces the width of fins 222, such that width $w_2$ is about 2 nm to about 20 nm. In some implementations, the trimming process can ease formation of subsequently formed layers (for example, by increasing spacing between fins 222). Though not depicted, it is understood that the trimming process may reduce height h of fins 222. In some implementations, the trimming process is tuned (or controlled) to reduce width $w_1$ while minimally affecting height h of fins 222 (for example, width $w_1$ of fins 222 is reduced at a faster rate than height h of fins 222). In some implementations, the trimming process is tuned to reduce width $w_1$ and height h at about the same rate, such that fins 222 also have a reduced height (though such is not depicted). Further, the present disclosure contemplates variations in height h, width $w_2$, and length l of fins 222 that may arise from the trimming process. For example, width $w_2$ may vary along fins 222 similarly to width $w_1$ as described above. In some implementations, the trimming process is applied to a subset of fins 222, where some fins 222 are not trimmed by the trimming process.

The trimming process implements any suitable process for reducing the dimension of fins 222. For example, in some implementations, the trimming process includes an etching process that can selectively etch fins 222 relative to other features of FinFET device 200. The etching process is a dry etching process, a wet etching process, or combinations thereof. In some implementations, a wet etching process implements an etching solution that includes ammonium hydroxide ($NH_4OH$), hydrogen peroxide ($H_2O_2$), sulfuric acid ($H_2SO_4$), tetramethylammonium hydroxide (TMAH), other suitable wet etching solution, or combinations thereof. For example, the wet etching solution can utilize an $NH_4OH:H_2O_2$ solution, an $NH_4OH:H_2O_2:H_2O$ solution (known as an ammonia-peroxide mixture (APM)), or an $H_2SO_4:H_2O_2$ solution (known as a sulfuric peroxide mixture (SPM)). In some implementations, a dry etching process implements an etchant gas that includes a fluorine-containing etchant gas (for example, $CF_4$, $SF_6$, $CH_2F_2$, $CHF_3$, and/or $C_2F_6$), an oxygen-containing gas, a chlorine-containing gas (for example, $Cl_2$, $CHCl_3$, $CCl_4$, and/or $BCl_3$), a bromine-containing gas (for example, HBr and/or $CHBR_3$), an iodine-containing gas, other suitable gases and/or plasmas, or combinations thereof. In some implementations, the trimming process implements an oxidation process. For example, the trimming process can expose fins 222 to an ozone environment, thereby oxidizing a portion of fins 222, which is subsequently removed by a cleaning process and/or an etching process, such as those described herein. By controlling the trimming process (such as trimming time, trimming process conditions, or other trimming parameter), a profile of fins 222 can be modified to meet various design requirements of FinFET device 200. For example, where the trimming process includes an etching process, various etching parameters, such as etchant used, etching temperature, etching solution concentration, etching pressure, source power, RF bias voltage, RF bias power, etchant flow rate, and/or other suitable etching parameters, are modified to remove a desired amount of fins 222 and/or to achieve a desired profile of fins 222.

Figures 2C, 2D:
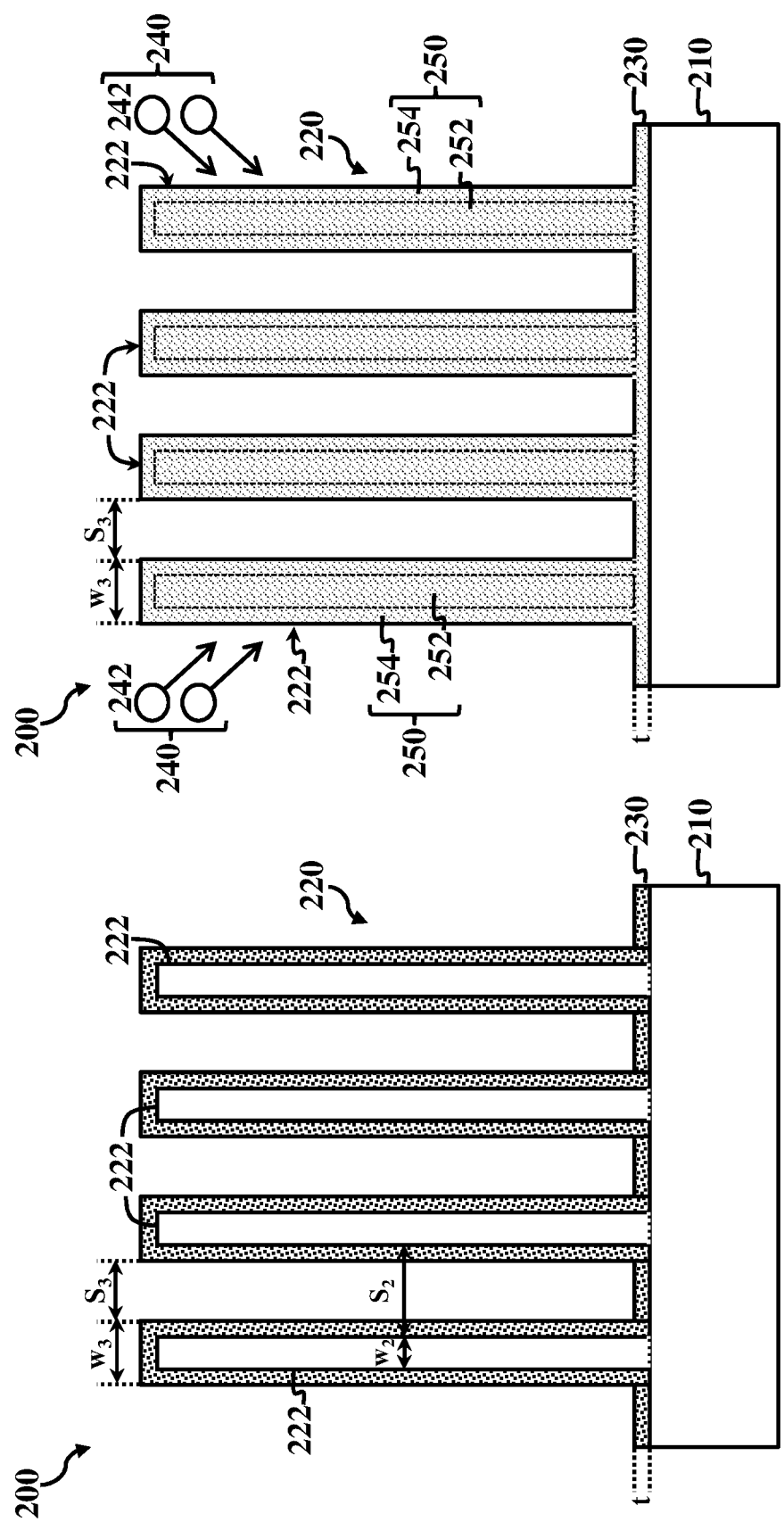

In FIG. 2C, a doped amorphous layer 230 is formed over fin structure 220. Doped amorphous layer 230 includes a material having a non-crystalline structure (in other words, a material having a disordered atomic structure). In some implementations, doped amorphous layer 230 and fin structure 220 include the same material, but with different atomic structures. For example, doped amorphous layer 230 includes the same material as fin structure 210, except the material has a non-crystalline structure. In the depicted embodiment, where fin structure 220 includes silicon in a crystalline structure, doped amorphous layer 230 includes silicon in a non-crystalline structure, such as amorphous silicon. Doped amorphous layer 230 may thus be referred to as a doped amorphous silicon layer. Alternatively, in some implementations, doped amorphous layer 230 and fin structure include different materials with different atomic structures. For example, fin structure 220 includes a semiconductor material, such as silicon germanium, and doped amorphous layer 230 includes silicon in a non-crystalline form, such as amorphous silicon. Depending on design requirements of FinFET device 200, doped amorphous layer 230 includes n-type dopants, p-type dopants, or combinations thereof. Where FinFET device 200 is configured as a p-type FinFET device, doped amorphous layer 230 includes p-type dopants, such as boron, germanium, indium, other p-type dopant, or combinations thereof. Where FinFET device 200 is configured as an n-type FinFET device, doped amorphous layer 230 includes n-type dopants, such as arsenic, phosphorus, other n-type dopant, or combinations thereof. In some implementations, doped amorphous layer 230 is heavily doped with a dopant having a dopant concentration in a range from about $1\times10^{21}$ dopants/$cm^3$ ($cm^{-3}$) to about $4\times10^{21}$ $cm^{-3}$. In some implementations, doped amorphous layer 230 has a higher dopant concentration than fin structure 220. For example, doped amorphous layer 230 may have a dopant concentration in a range from about $1\times10^{21}$ $cm^{-3}$ to about $4\times10^{21}$ $cm^{-3}$, while fin structure 220 may have a dopant concentration in a range from about $1\times10^{10}$ $cm^{-3}$ to about $1\times10^{18}$ $cm^{-3}$ (in some implementations, fin structure 220 is considered undoped or intrinsic at or below such doping concentrations).

Doped amorphous layer 230 wraps fin structure 220. For example, fins 222 include a top portion defined between sidewall portions (such as the sidewalls defining width $w_2$ of fins 222), where doped amorphous layer 230 is disposed on the top portion and sidewall portions. In some implementations, the top portion is a substantially horizontal side (for example, substantially parallel to an x-y plane) of fin structure 220, while sidewall portions are substantially vertical sides (for example, substantially parallel to an x-z plane) of fin structure 220. Doped amorphous layer 230 has a thickness t. In some implementations, doped amorphous layer 230 has a thickness t is about 1 nm to about 10 nm. For example, in the depicted embodiment, thickness t is about 3 nm to about 5 nm. In some implementations, a final width of fins 222 will meet a defined target width ($w_t$), such as a critical dimension defined by design specifications and/or an integrated circuit (IC) design layout for FinFET device 200. In such implementations, a width $w_3$ represents width $w_2$ of fins 222 combined with thickness t of doped amorphous layer 230 (for example, $w_3 \approx w_2+t$), where width $w_3$ is substantially equal to target width $w_t$ (for example, $w_3 \approx w_t$). In some implementations, thickness t is substantially equal to a width $w_r$ of fins 222 removed during the trimming process (for example, $t \approx w_r$). The present disclosure contemplates variations in width $w_3$ and thickness t arising from processing as described herein.

Doped amorphous layer 230 is formed by a suitable deposition process, such as chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), spin coating, plating, other deposition method, or combinations thereof. In the depicted embodiment, doped amorphous layer 230 is conformally deposited over fin structure 220, such that thickness t is substantially uniform over exposed surfaces of fin structure 220 and/or substrate 210. Any suitable process (for example, an ion implantation process, a diffusion process, an in-situ doping process, or combinations thereof) can be implemented for doping the material deposited over the fin structure 220. In some implementations, a selective epitaxial growth (SEG) process is performed to grow a semiconductor material on exposed portions of fin structure 220, where dopants are introduced into the semiconductor material during the SEG process (for example, by adding dopants to a source material of the SEG process), thereby forming doped amorphous layer 230. The SEG process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The SEG process can use gaseous precursors (for example, silicon-containing gases, such as $SiH_4$ and/or germanium-containing gases, such as $GeH_4$) and/or liquid precursors, which interact with a composition of fin structure 220. For example, in the depicted embodiment, where doped amorphous layer 230 is a doped amorphous silicon layer, the deposition process can expose fin structure 220 (and substrate 210) to a silicon-containing gas (for example, a silicon hydride containing gas (such as $SiH_4$, $Si_2H_6$, $Si_3H_8$, $Si_4H_{10}$, or combinations thereof)) and add dopants (for example, germanium, boron, arsenic, phosphorous, or combinations thereof) to the silicon-containing gas. In some implementations, doped amorphous layer 230 includes materials and/or dopants that achieve desired tensile stress and/or compressive stress in a channel region of FinFET device 200.

In FIG. 2D, a knock-on implantation process 240 is performed on doped amorphous layer 230, thereby forming a doped feature 250. Knock-on implantation process 240 bombards doped amorphous layer 230 with ions 242, where ions 242 drive dopant from doped amorphous layer 230 into fin structure 220 and/or substrate 210 (in other words, ions 242 knock dopant from doped amorphous layer 230 into fin structure 220 and substrate 210). Ions 242 can include carbon, germanium, argon, nitrogen, and/or other ions that will not adversely affect the operating characteristics of FinFET device 200. In the depicted embodiment, ions 242 are argon atoms. In some implementations, ions 242 are non-doping species. Knock-on implantation process 240 can be performed at a tilt angle α, where the tilt angle α can be tuned to minimize shadowing effects while maximizing ion depth into doped amorphous layer 230 and/or dopant depth into fin structure 220 and/or substrate 210. In some implementations, knock-on implantation process 240 is a plasma immersion ion implantation (PIII) process (also referred to as plasma doping). In some implantations, knock-on implantation process 240 is performed at a temperature of about 20° C. to about 40° C., and in some implementations, is performed at about room temperature (for example, about 20° C. to about 25° C.). In some implantations, knock-on implantation process 240 uses a bias voltage (also referred to as an implant voltage) of about 1 kV to about 5 kV. In some implementations, bias voltage generally refers to a DC bias voltage applied to substrate 210 during knock-on implantation process 240. Knock-on implantation process 240 is achieved with much lower implant voltages than those implemented by traditional doping techniques for fin structure 220. For example, traditional ion implantation processes typically require bias voltages of about 8 kV to about 15 kV, while other doping techniques can require bias voltages of about 20 kV to about 50 kV to ensure that dopants penetrate fins to sufficient depths. Such high voltage implantation processes have been observed to damage fins, often damaging a profile of the fins. In contrast, performing knock-on implantation process 240 on doped amorphous layer 230 using bias voltages less than about 5 kV can sufficiently drive dopants into fin structure 220 (in some implementations, driving dopants as much as 20 nm into fin structure 220) without damaging a profile of fin structure 220, thereby providing improvements over traditional doping techniques. Furthermore, knock-on implantation process 240 can better control dopant profiles of fin structure 220 compared to traditional ion implantation processes, which often exhibit less effective dopant profiles, resulting from dopant scattering and dopant angle constraints of the traditional ion implantation processes.

By driving dopant into fins 222, knock-on implantation process 240 forms a doped portion 252 of fins 222, while also causing at least a portion of doped amorphous layer 230 to become a part of fin structure 220. In particular, knock-on implantation process 240 modifies an atomic structure of a portion of doped amorphous layer 230, converting (crystallizing) a portion of the non-crystalline material of doped amorphous layer 230 into crystalline material. In the depicted embodiment, knock-on implantation process 240 converts doped amorphous layer 230 into doped layer 254, such that doped amorphous layer 230 in its entirety becomes a part of fin structure 220 and no portion of doped amorphous layer 230 remains. Doped feature 250 thus includes doped portion 252 and doped layer 254. Where fin structure 220 includes silicon and doped amorphous layer 230 includes amorphous silicon, knock-on implantation process 240 crystallizes the amorphous silicon (in other words, reorders its atomic structure), such that doped feature 250 is a doped silicon feature. Alternatively, where fin structure 220 includes silicon germanium (or other semiconductor material) and doped amorphous layer 230 includes amorphous silicon, knock-on implantation process 240 crystallizes the amorphous silicon (in other words, reorders its atomic structure), such that doped feature 250 is includes a doped silicon feature and a doped silicon germanium (or other semiconductor material) feature. In some implementations, doped layer 254 is a silicon capping layer. In some implementations, doped feature 250 is a lightly doped source and drain (LDD) feature (or region) disposed in a source region and/or a drain region of fin structure 220. In some implementations, doped feature 250 is a doped well (or region) of FinFET device 200, such as a doped well for defining an active region of FinFET device 200. It has been observed that doped feature 250 exhibits deeper, greater, and/or more uniform doping profiles compared to doped features formed using traditional doping techniques, such as ion implantation processes and/or knock-on implantation processes using doped layers having materials in crystalline structures. In some implementations, doped feature 250 has a dopant concentration in a range from about $1 \times 10^{20}$ $cm^{-3}$ to about $5 \times 10^{20}$ $cm^{-3}$. In some implementations, a doping concentration in doped feature 250 is substantially uniform across a width and/or a height of fins 222. In some implementations, the doping concentration is considered substantially uniform when the doping concentrations at any defined number of points across the width of doped feature 250, across the height of doped feature 250, and/or within doped feature 250 are within ±5% of each other. In some implementations, a dopant concentration of doped portion 252 is substantially the same to a dopant concentration of doped layer 254. In some implementations, the doping concentration is considered substantially the same when the doping concentration of doped portion 252 (such as an average doping concentration) and the doping concentration of the doped layer 254 (such as an averaged doping concentration) are within ±5% of each other.

Figure 2E:
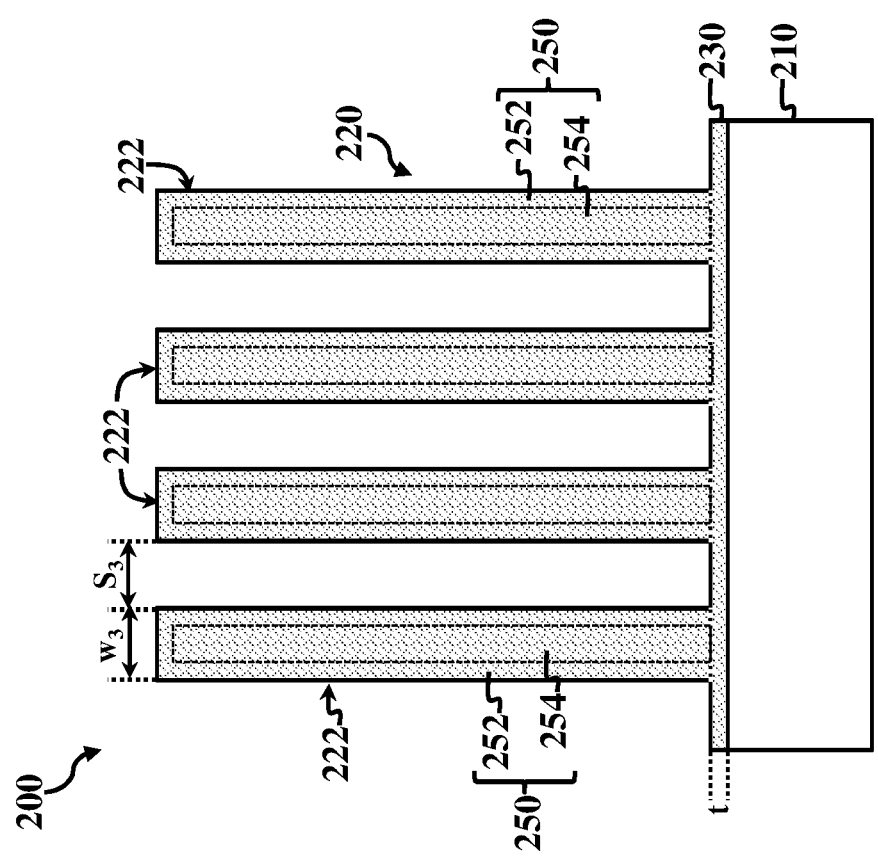

Traditional doping techniques for FinFETs often require removal of a material layer (such as a doped layer) after forming a doped feature, which causes surface damage and/or other damage to the fin structure. By converting the doped amorphous layer 230 into a part of fin structure 220, no further processing is required for removing doped amorphous layer 230, leaving FinFET device 200 as depicted in FIG. 2E. Subsequent wet etching processes and/or subsequent cleaning processes can thus be eliminated, minimizing surface damage (such as surface roughness) and/or other damage to fin structure 220. Further, converting doped amorphous layer 230 into a part of fin structure 220 minimizes space $S_3$ between fins 222, improving fin-to-fin merging process windows (for example, where epitaxial source and drain features are subsequently formed on fins 222, where such epitaxial source and drain features combine to form a merged epitaxial source and drain feature).

FIGS. 3A-3E are fragmentary cross-sectional views of a FinFET device 300, in portion or entirety, at various fabrication stages (such as those associated with method 100) according to various aspects of the present disclosure. In some implementations, FinFET device 300 may be a portion of IC chip, an SoC, or portion thereof, that includes various passive and active microelectronic devices such as resistors, capacitors, inductors, diodes, MOSFETs, CMOSs, BJTs, LDMOSs, high voltage transistors, high frequency transistors, other suitable components, or combinations thereof. FinFET device 300 is similar in many respects to FinFET device 200. Accordingly, similar features in FIGS. 2A-2E and FIG. 3A-3E are identified by the same reference numerals for clarity and simplicity. FIGS. 3A-3E have been simplified for the sake of clarity to better understand the inventive concepts of the present disclosure. Additional features can be added in FinFET device 300, and some of the features described below can be replaced, modified, or eliminated in other embodiments of FinFET device 300.

In FIG. 3A, similar to FinFET device 200, FinFET device 300 includes substrate 210 and fin structure 220 (including fins 222 extending from substrate 210), which are described in detail above with reference to FIG. 2A. In contrast to fabrication of FinFET device 200, no trimming process is performed on FinFET device 300. In FIG. 3B, fabrication of FinFET device 300 thus proceeds with forming doped amorphous layer 230 over fin structure 220, which is described in detail above with reference to FIG. 2C.

In FIG. 3C, similar to FinFET device 200, knock-on implantation process 240 is performed on doped amorphous layer 230, where ions 242 drive dopant from doped amorphous layer 230 into fin structure 220 and/or substrate 210, as described in detail above with reference to FIG. 2D. In contrast to fabrication of FinFET device 200, only a portion of doped amorphous layer 230 becomes a part of fin structure 220 during knock-on implantation process 240, such that fin structure 220 includes a doped feature 350, which includes a doped portion 352 of fins 222 and a doped layer 354 (alternatively referred to as a converted portion of doped amorphous layer 230). For example, knock-on implantation process 240 converts only a portion of doped amorphous layer 230 into doped layer 354, such that a portion of doped amorphous layer 230 remains over fin structure 220. In particular, knock-on implantation process 240 modifies an atomic structure of a portion of doped amorphous layer 230, converting (crystallizing) a portion of the non-crystalline material of doped amorphous layer 230 into crystalline material. Where fin structure 220 includes silicon and doped amorphous layer 230 includes amorphous silicon, knock-on implantation process 240 crystallizes the amorphous silicon (in other words, reorders its atomic structure), such that doped feature 350 is a doped silicon feature. Alternatively, where fin structure 220 includes silicon germanium (or other semiconductor material) and doped amorphous layer 230 includes amorphous silicon, knock-on implantation process 240 crystallizes the amorphous silicon (in other words, reorders its atomic structure), such that doped feature 350 is includes a doped silicon feature and a doped silicon germanium (or other semiconductor material) feature. In some implementations, doped layer 354 is a silicon capping layer. In further contrast to FinFET device 200, knock-on implantation process 140 drives dopant partially into fin structure 220, such that FinFET device 300 includes fins 222 having doped portion 352 and an undoped portion 356 (which, in some implementations, indicates portions of fins 222 having a doping concentration that is less than a doping concentration of doped portion 352).

After the knock-on implantation process 140, doped amorphous layer 230 has a thickness $t_1$, and doped layer 354 has a thickness $t_2$, both of which are less than an original thickness of doped amorphous layer 230 (here, thickness t). In some implementations, thickness $t_1$ is about 1 nm to about 7 nm, and thickness $t_2$ is about 1 nm to about 3 nm. In some implementations, a final width of fins 222 will meet a defined target width ($w_t$), such as a critical dimension defined by design specifications and/or an integrated circuit (IC) design layout for FinFET device 300. In such implementations, a width $w_4$ represents width $w_1$ of fins 222 combined with thickness $t_2$ of doped layer 354 (for example, $w_4 \approx w_1 + t_2$), where width $w_4$ is substantially equal to target width $w_t$ (for example, $w_4 \approx w_t$). In some implementations, knock-on implantation process 240 is tuned to ensure that a sufficient portion of doped amorphous layer 230 is converted into doped layer 354, such that width $w_4$ is substantially equal to target width $w_t$. The present disclosure contemplates variations in width $w_4$, thickness $t_1$, and thickness $t_2$ arising from processing as described herein.

In some implementations, doped feature 350 is a lightly doped source and drain feature (or region) disposed in a source region and/or a drain region of fin structure 220. In some implementations, doped feature 350 is a doped well (or region) of FinFET device 300, such as a doped well for defining an active region of FinFET device 300. It has been observed that doped feature 350 exhibits deeper, greater, and/or more uniform doping profiles compared to doped features formed using traditional doping techniques, such as ion implantation processes and/or knock-on implantation processes using doped layers having materials in crystalline structures. In some implementations, doped feature 350 has a dopant concentration in a range from about $1 \times 10^{20}$ cm$^{-3}$ to about $5 \times 10^{20}$ cm$^{-3}$. In some implementations, a doping concentration in doped feature 350 is substantially uniform across its thickness. In some implementations, the doping concentration is considered substantially uniform when the doping concentrations at any defined number of points across a thickness of doped feature 350 are within ±5% of each other. In some implementations, a dopant concentration of doped portion 352 is substantially the same to a dopant concentration of doped layer 354. In some implementations, the doping concentration is considered substantially the same when the doping concentration of doped portion 352 (such as an average doping concentration) and the doping concentration of the doped layer 354 (such as an averaged doping concentration) are within ±5% of each other.

Figure 3E:
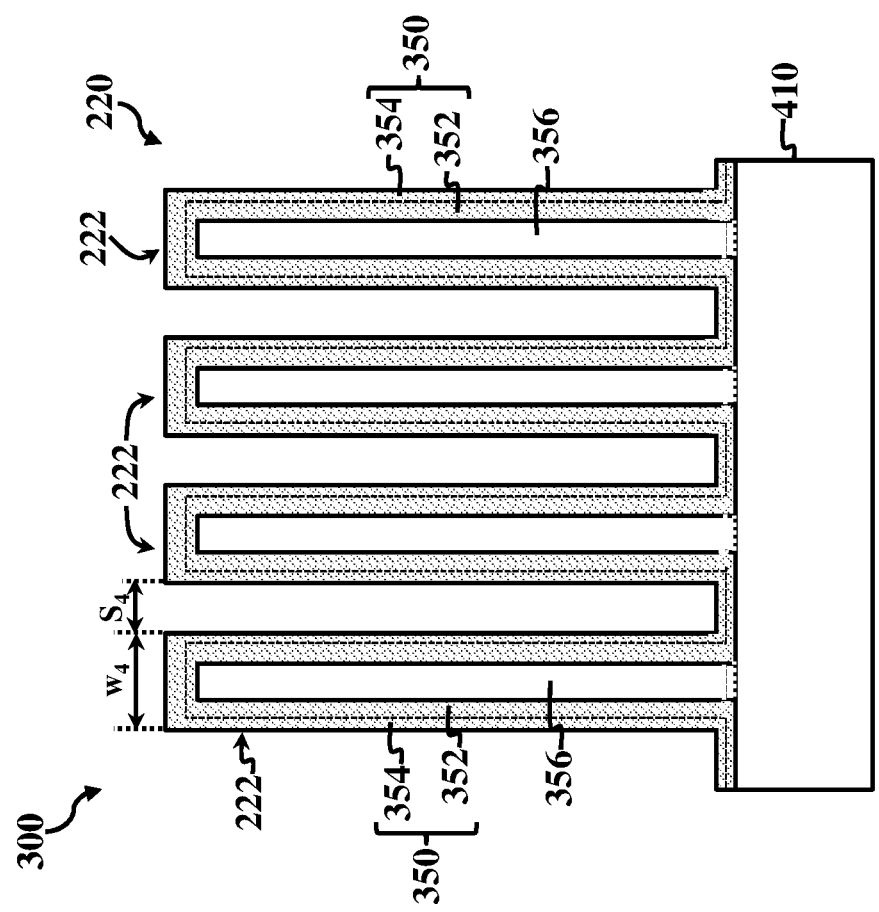

Any remaining portion of doped amorphous layer 230 is removed by a suitable process. In FIG. 3D, an oxidation process is performed on doped amorphous layer 230, thereby forming an oxidized doped amorphous layer 360. In some implementations, the oxidation process is a high temperature oxidation process. For example, doped amorphous layer 230 is exposed to an ozone environment at a temperature of about 800° C. to about 1,000° C., thereby oxidizing doped amorphous layer 230. In some implementations, the oxidation process is a rapid thermal oxidation (RTO) process. Subsequently, oxidized doped amorphous layer 360 is removed by a suitable wet etching process and/or cleaning process, leaving FinFET device 300 as depicted in FIG. 3E. In some implementations, the cleaning process is an SPM cleaning process, for example, implementing an SPM wet etching solution. In such implementations, the SPM cleaning process can be performed at a temperature of about 150° C. to about 200° C. By oxidizing the doped amorphous layer 230, gentler wet etching processes and/or cleaning processes can be implemented to remove oxidized doped amorphous layer 360, minimizing or eliminating surface damage (such as surface roughness) and/or other damage to fin structure 220, compared to wet etching processes and/or cleaning processes used in traditional doping techniques. Further, converting a portion of doped amorphous layer 230 into a part of fin structure 220 minimizes space $S_4$ between fins 222, improving fin-to-fin merging process windows (for example, where epitaxial source and drain features are subsequently formed on fins 222, where such epitaxial source and drain features combine to form a merged epitaxial source and drain feature).

Figure 4:
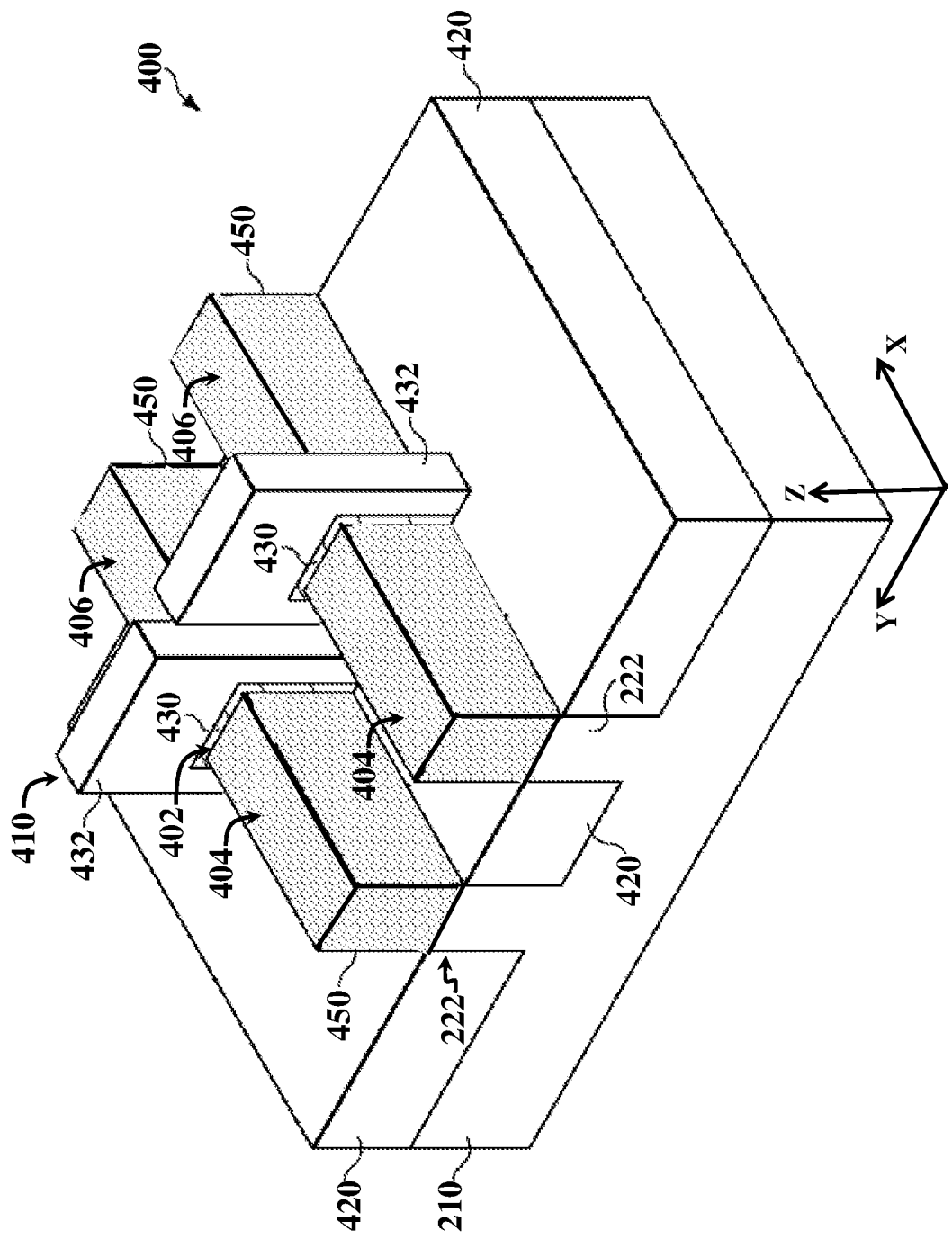
FIG. 4 is a perspective, three-dimensional view of yet another FinFET device, in portion or entirety, at various fabrication stages, such as those associated with FIG. 1 and FIGS. 2A-2E, according to various aspects of the present disclosure.

FIG. 4 is a perspective, three-dimensional view of FinFET device 400 (for example, in an x-y-z plane) after undergoing processing as described with reference to FIGS. 2A-2E to form lightly doped source and drain regions according to various aspects of the present disclosure. FinFET device 400 may be included in a microprocessor, a memory, and/or other integrated circuit device. In some implementations, FinFET device 400 may be a portion of IC chip, an SoC, or portion thereof, that includes various passive and active microelectronic devices such as resistors, capacitors, inductors, diodes, MOSFETs, CMOSs, BJTs, LDMOSs, high voltage transistors, high frequency transistors, other suitable components, or combinations thereof. FinFET device 400 is similar in many respects to FinFET device 200. Accordingly, similar features in FIGS. 2A-2E and FIG. 4 are identified by the same reference numerals for clarity and simplicity. FIG. 4 has been simplified for the sake of clarity to better understand the inventive concepts of the present disclosure. Additional features can be added in FinFET device 400, and some of the features described below can be replaced, modified, or eliminated in other embodiments of FinFET device 400.

Similar to FinFET device 200, FinFET device 400 includes substrate 210 and fin structure 220, which includes fins 222 extending from substrate 210. In FIG. 4, fins 222 extend from substrate 210 in a z-direction, such that fins 222 have heights defined in the z-direction (such as height h), lengths defined in an x-direction, and widths and/or spacings defined in a y-direction (such as width $w_1$, width $w_2$, width $w_3$, spacing $S_1$, spacing $S_2$, and spacing $S_3$). Each fin 222 has a channel region 402, a source region 404, and a drain region 406 defined along the length of respective fins 222 (here, along the x-direction), where channel region 402 is disposed between source region 404 and drain region 406 (generally referred to as source/drain regions). Each channel region 402 includes a top portion defined between sidewall portions of a respective fin 222, where the top portion and the sidewall portions engage with a gate structure 410 (described in detail below), such that current can flow between a respective source region 404 and a respective drain region 406 during operation of FinFET device 400. In FIG. 4, gate structure 410 blocks view of channel regions 402 of fins 222. In some implementations, the top portion is a substantially horizontal side (for example, substantially parallel to an x-y plane) of fins 222, while the two sidewall portions are substantially vertical sides (for example, substantially parallel to an x-z plane) of fins 222.

Fabricating FinFET device 400 is similar to fabrication of FinFET device 200 described with reference to FIGS. 2A-2E. However, before forming doped amorphous layer 230, an isolation feature(s) 420 is formed over and/or in substrate 210 to isolate various regions, such as various device regions, of FinFET device 400. For example, isolation features 420 separate and isolate fins 222 from each other. In the depicted embodiment, isolation features 420 surround a portion of fin structure 220, such as a bottom portion of fin structure 220. Isolation features 420 include silicon oxide, silicon nitride, silicon oxynitride, other suitable isolation material, or combinations thereof. Isolation features 420 can include different structures, such as shallow trench isolation (STI) structures, deep trench isolation (DTI) structures, and/or local oxidation of silicon (LOCOS) structures. In some implementations, isolation features 420 include STI features that define and electrically isolate fin structures 220 from other active device regions and/or passive device regions. For example, STI features can be formed by etching trenches in substrate 210 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation features 420. In another example, STI features can be formed by depositing an insulator material over substrate 210 after forming fin structure 220 (in some implementations, such that the insulator material layer fills gaps (trenches) between fins 222) and etching back the insulator material layer to form isolation features 420. In some implementations, STI features include a multi-layer structure that fills the trenches. For example, STI features include a silicon nitride layer disposed over a thermal oxide liner layer. In another example, STI features include a dielectric layer disposed over a doped liner layer (such as a boron silicate glass (BSG) liner layer or a phosphosilicate glass (PSG) liner layer). In yet another example, STI features include a bulk dielectric layer disposed over a liner dielectric layer, where the bulk dielectric layer and the liner dielectric layer include materials depending on design requirements.

Further, in such implementations, before forming doped amorphous layer 230, gate structure 410 can be formed over fin structure 220. Gate structure 410 wraps channel regions 402 of fins 222, thereby engaging fins 222 and interposing source regions 404 and drain regions 406. In the depicted embodiment, gate structure 410 engages the top portion and the sidewall portions of channel regions 402, such that gate structure 410 engages three sides of channel regions 402. Gate structure 410 includes a dummy gate stack, portions of which can be replaced with a metal gate during a gate replacement process as described in detail below. In the depicted embodiment, the dummy gate stack includes a gate dielectric 430 and a gate electrode 432. Gate dielectric 430 is disposed between gate electrode 432 and fins 222, where gate dielectric 430 and gate electrode 432 are configured to wrap fins 222 (in particular, channel regions 402). Gate dielectric 430 includes a dielectric material, such as silicon oxide, a high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. Gate electrode 432 includes a suitable dummy gate material, such as polysilicon. The dummy gate stack can include numerous other layers, for example, capping layers, interface layers, diffusion layers, barrier layers, hard mask layers, or combinations thereof. In some implementations, the dummy gate stack further includes an interfacial layer, such as a silicon oxide layer, disposed between gate dielectric 430 and gate electrode 432. In some implementations, a capping layer, such as a TiN capping layer, can be disposed between gate dielectric 430 and gate electrode 432.

Gate structure 410 is formed by deposition processes, lithography processes, etching processes, other suitable processes, or combinations thereof. For example, a deposition process can be performed to form a gate dielectric layer over substrate 210, particularly over fin structures 220 and isolation features 420, and a deposition process can be performed to form a gate electrode layer over the gate dielectric layer. In some implementations, a deposition process is performed to form an interfacial layer over substrate 210 before forming the gate dielectric layer. The deposition processes include CVD, PVD, ALD, HDPCVD, MOCVD, RPCVD, PECVD, LPCVD, ALCVD, APCVD, plating, other suitable methods, or combinations thereof. A lithography patterning and etching process can then performed to pattern the gate dielectric layer and the gate electrode layer (and, in some implementations, the interfacial layer) to form gate dielectric 430 and gate electrode 432. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. In yet another alternative, the lithography patterning process implements nanoimprint technology. The etching processes include dry etching processes, wet etching processes, other etching processes, or combinations thereof.

After forming gate structure 410, lightly doped source and drain (LDD) features 450 are formed in source region 404 and drain region 406 of FinFET device 400. LDD features 450 are similar to doped feature 250 of FinFET device 200, which is described in detail above with reference to FIGS. 2A-2E. For example, a doped amorphous layer is formed over source region 404 and drain region 406 of fins 222, and a knock-on implantation process is performed on the doped amorphous layer to drive dopant from the doped amorphous layer into source region 404 and drain region 406. The knock-on implantation process also converts the doped amorphous layer into a portion of fins 222, such that LDD features 450 include a doped portion of fins 222 and converted (re-crystallized) doped amorphous layer. In some implementations (such as the depicted embodiment), a fin trimming process, such as described above, is performed before forming isolation feature 420 and/or gate structure 410. Alternatively, in some implementations, the fin trimming process is performed after forming the isolation feature 420 and/or gate structure 410, such that the a width of a top portion of fins 222 (such as a portion of fins 222 extending above isolation feature 420) is less than a width of a bottom portion of fins 222. Thereafter, FinFET device 400 can undergo subsequent fabrication, as described below.

Figure 5:
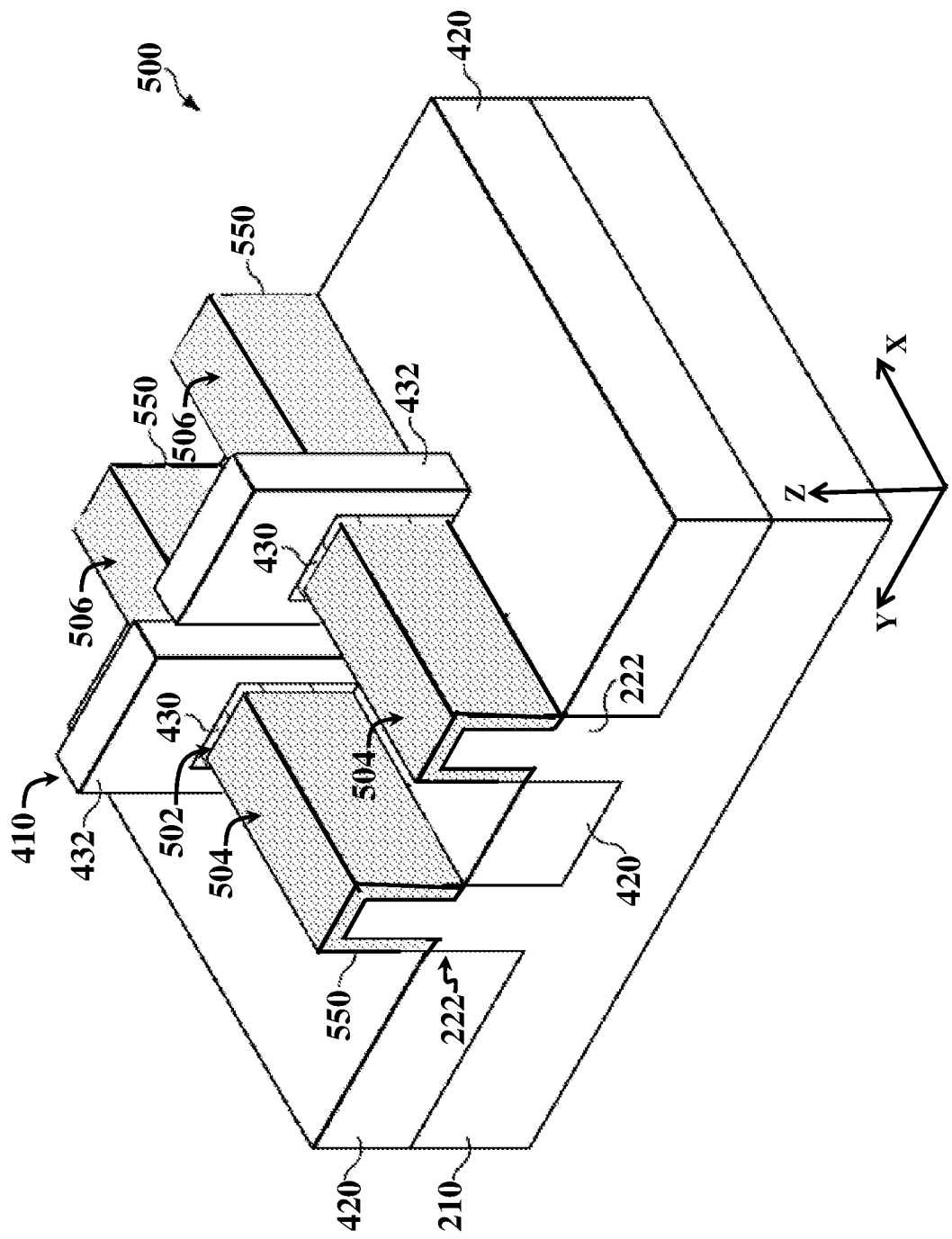
FIG. 5 is a perspective, three-dimensional view of yet another FinFET device, in portion or entirety, at various fabrication stages, such as those associated with FIG. 1 and FIGS. 3A-3E, according to various aspects of the present disclosure.

FIG. 5 is a perspective, three-dimensional view of FinFET device 500 (for example, in an x-y-z plane) after undergoing processing as described with reference to FIGS. 3A-3E to form lightly doped source and drain regions according to various aspects of the present disclosure. FinFET device 500 may be included in a microprocessor, a memory, and/or other integrated circuit device. In some implementations, FinFET device 500 may be a portion of IC chip, an SoC, or portion thereof, that includes various passive and active microelectronic devices such as resistors, capacitors, inductors, diodes, MOSFETs, CMOSs, BJTs, LDMOSs, high voltage transistors, high frequency transistors, other suitable components, or combinations thereof. FinFET device 500 is similar in many respects to FinFET device 300 and FinFET device 400. Accordingly, similar features in FIGS. 3A-3E, FIG. 4, and FIG. 5 are identified by the same reference numerals for clarity and simplicity. FIG. 5 has been simplified for the sake of clarity to better understand the inventive concepts of the present disclosure. Additional features can be added in FinFET device 500, and some of the features described below can be replaced, modified, or eliminated in other embodiments of FinFET device 500.

Similar to FinFET device 300, FinFET device 500 includes substrate 210 and fin structure 220, which includes fins 222 extending from substrate 210. In FIG. 5, fins 222 extend from substrate 210 in a z-direction, such that fins 222 have heights defined in the z-direction (such as height h), lengths defined in an x-direction, and widths and/or spacings defined in a y-direction (such as width $w_1$, width $w_4$, spacing $S_1$, and spacing $S_4$). Each fin 222 has a channel region 502, a source region 504, and a drain region 506 defined along the length of respective fins 222 (here, along the x-direction), where channel region 502 is disposed between source region 504 and drain region 506 (generally referred to as source/drain regions). Each channel region 502 includes a top portion defined between sidewall portions of a respective fin 222, where the top portion and the sidewall portions engage with gate structure 410 (described in detail above), such that current can flow between a respective source region 504 and a respective drain region 506 during operation of FinFET device 500. In FIG. 5, gate structure 410 blocks view of channel regions 502 of fins 222.

Fabricating FinFET device 500 is similar to fabrication of FinFET device 300 described with reference to FIGS. 3A-3E. However, before forming doped amorphous layer 230, similar to FinFET device 400, isolation feature(s) 420 is formed over and/or in substrate 210 to isolate various regions of FinFET device 500, as described above. Similar to FinFET device 400, before forming doped amorphous layer 230, gate structure 410 is also formed over fin structure 220, as described above. After forming gate structure 410, LDD features 550 are formed in source region 504 and drain region 506 of FinFET device 500. LDD features 550 are similar to doped feature 350 of FinFET device 300, which is described in detail above with reference to FIGS. 3A-3E. For example, a doped amorphous layer is formed over source region 504 and drain region 506 of fins 222, and a knock-on implantation process is performed on the doped amorphous layer to drive dopant from the doped amorphous layer into a portion of source region 504 and drain region 506. The knock-on implantation process also converts a portion of the doped amorphous layer into a portion of fins 222, such that LDD features 550 include a doped portion of fins 222 and a converted (re-crystallized) portion of the doped amorphous layer. Thereafter, any remaining doped amorphous layer is removed, for example, by an oxidation removal process. Thereafter, FinFET device 500 can undergo further processing.

FinFET device 400 and/or FinFET device 500 can undergo further processing. For example, spacers can be formed adjacent to gate structure 410 (here, gate dielectric 430 and gate electrode 432). The spacers include a dielectric material, such as silicon oxide, silicon nitride, silicon oxynitride, silicon carbide, other suitable material, or combinations thereof. In some implementations, the spacers include a multi-layer structure, such as a silicon nitride layer and a silicon oxide layer. The spacers are formed by any suitable process. In some implementations, spacers include more than one set of spacers, such as seal spacers, offset spacers, dummy spacers and/or main spacers formed adjacent to the dummy gate stack. In such implementations, the various sets of spacers can include materials having different etching rates. For example, a silicon oxide layer can be deposited over fin structure 220 and subsequently anisotropically etched (for example, dry etched) to form a first spacer set adjacent to the dummy gate stack, and a silicon nitride layer can be deposited over fin structure 220 and subsequently etched (for example, dry etched) to form a second spacer set adjacent to the first spacers set.

A gate replacement process can then performed to replace the dummy gate stack of gate structure 410 with a gate, such as a metal gate stack. For example, an inter-level dielectric (ILD) layer can be formed over substrate 210, for example, by a deposition process (such as CVD, PVD, ALD, HDPCVD, MOCVD, RPCVD, PECVD, LPCVD, ALCVD, APCVD, plating, other suitable methods, or combinations thereof). The ILD layer includes a dielectric material, such as silicon oxide, silicon nitride, silicon oxynitride, TEOS formed oxide, PSG, borophosphosilicate glass (BPSG), low-k dielectric material, other suitable dielectric material, or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, or combinations thereof. In some implementations, the ILD layer can include a multilayer structure having multiple dielectric materials. Subsequent to the deposition of the ILD layer, a CMP process may be performed, such that a top portion of gate structure 410 is reached (exposed), such as a top portion of gate electrode 432. A portion of gate structure 410 (such as gate electrode 432, and in some implementations, gate dielectric 430) is then removed, thereby forming a trench (opening), which may expose an interfacial layer and/or gate dielectric (such as gate dielectric 430). In some implementations, an etching process selectively removes the dummy gate electrode (and, in some implementations, a dummy gate dielectric). The etching process is a dry etching process, a wet etching process, or combinations thereof. A selective etching process can be tuned, such that the dummy gate electrode layer has an adequate etch rate relative to the interfacial layer, the spacers, and/or the ILD layer.

A metal gate stack of gate structure 410 is then formed in the opening (trench). The metal gate stack includes a gate dielectric and a gate electrode (for example, a work function layer and a metal fill layer). The metal gate stack of gate structure 410 may include numerous other layers, for example, capping layers, interface layers, diffusion layers, barrier layers, hard mask layers, or combinations thereof. In some implementations, a gate dielectric layer is formed over the interfacial layer, and a gate electrode layer (such as a work function fill layer and a metal fill layer) is formed over the gate dielectric layer. The gate dielectric layer includes a dielectric material, such as silicon oxide, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some implementations, the gate dielectric layer is a high-k dielectric layer. In some implementations, where an interfacial layer is omitted from the dummy gate stack, the gate dielectric layer can include an interfacial layer (such as a silicon oxide layer), and a high-k dielectric layer disposed over the interfacial layer. The gate electrode includes a conductive material, such as polysilicon, Al, Cu, Ti, Ta, W, Mo, TaN, NiSi, CoSi, TiN, WN, TiAl, TiAlN, TaCN, TaC, TaSiN, other conductive material, or combinations thereof. In some implementations, the work function layer is a conductive layer tuned to have a desired work function (such as an n-type work function or a p-type work function), and the metal fill layer is a conductive layer formed over the work function layer. In some implementations, the work function layer includes n-type work function materials, such as Ti, Ag, TaAl, TaAlC, TiAlN, TaC, TaCN, TaSiN, Mn, Zr, other suitable n-type work function materials, or combinations thereof. In some implementations, the work function layer includes a p-type work function material, such as TiN, TaN, Ru, Mo, Al, WN, $ZrSi_2$, $MoSi_2$, $TaSi_2$, $NiSi_2$, WN, other suitable p-type work function materials, or combinations thereof. The metal fill layer includes a suitable conductive material, such as aluminum, tungsten, or copper. The metal fill layer may additionally or collectively include polysilicon, titanium, tantalum, metal alloys, other suitable materials, or combinations thereof. The gate dielectric layer, the work function layer, and the metal fill layer are formed by various deposition processes, such as ALD, CVD, PVD, and/or other suitable process. In some implementations, the work function layer and the metal fill layer may conform to exposed surfaces in the opening. CMP process can be performed to remove excess material (such as any excess work function layer and/or any excess metal fill layer), planarizing gate structure 410.

In some implementations, additional source/drain features, such as heavily doped source and drain (HDD) features are formed in fins 222. In some implementations, epitaxial source features and epitaxial drain features (referred to as epitaxial source/drain features) are formed over LDD features 450 and/or LDD features 550. For example, forming LDD features 450 and/or LDD features 550, a SEG process is performed to grow a semiconductor material on exposed portions of fins 222, thereby forming epitaxial source/drain features over source region 404 (and/or source region 504) and drain region 406 (and/or drain region 506). In some implementations, the epitaxial source/drain features wrap source region 404 (and/or source region 504) and drain region 406 (and/or drain region 506). The SEG process can implement CVD deposition techniques (for example, VPE, UHV-CVD, LPCVD, and/or PECVD), molecular beam epitaxy, other suitable SEG processes, or combinations thereof. The SEG process can use gaseous precursors (for example, Si-containing gases, such as $SiH_4$ and/or Ge-containing gases, such as $GeH_4$) and/or liquid precursors, which interact with a composition of fins 222. Dopants may be introduced into the SEG process, such that the epitaxial source/drain features are in situ doped during the SEG process. For example, the epitaxial source/drain features are doped during deposition by adding dopants to a source material of the SEG process. In some implementations, where FinFET device 400 and/or FinFET device 500 is configured as an n-type device (for example, having an n-channel), the epitaxial source/drain features include silicon or silicon carbon, where the silicon or silicon carbon is doped with phosphorous, arsenic, other n-type dopant, or combinations thereof (for example, forming Si:P epitaxial layers or Si:C:P epitaxial layers). In some implementations, where FinFET device 400 and/or FinFET device 500 is configured as a p-type device (for example, having a p-channel), the epitaxial source/drain features include silicon germanium (SiGe), where the SiGe layers are doped with boron, other p-type dopant, or combinations thereof (for example, forming a Si:Ge:B epitaxial layer). In some implementations, the epitaxial source/drain features include materials and/or dopants that achieve desired tensile stress and/or compressive stress in channel region 402 and/or channel region 502 depending on design requirements.

Various contacts can be formed to facilitate operation of FinFET device 400 and/or FinFET device 500. For example, an ILD layer can be formed over substrate 210 (in some implementations, a second ILD layer formed over a first ILD layer (formed during the gate replacement process). Contacts can then be formed in the ILD layer(s). For example, a contact is electrically coupled with gate structure 410 (particularly, the gate electrode), a contact is electrically coupled to source region 404, and a contact is electrically coupled to drain region 406. Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, the ILD layer(s) and contacts (for example, extending through the ILD layer(s)) are a portion of a multilayer interconnect (MLI) feature disposed over substrate 210. The MLI feature electrically couples various components of FinFET device 400 and/or FinFET device 500, such that the various components are operable to function as specified by design requirements of FinFET device 400 and/or FinFET device 500. The MLI feature can include a combination of metal layers and ILD layers configured to form vertical interconnect features, such as contacts and/or vias, and/or horizontal interconnect features, such as lines. The various conductive features include materials similar to the contacts. In some implementations, a damascene process and/or dual damascene process is used to form a copper-based multilayer interconnection structure.

The present disclosure provides for many different embodiments. An exemplary method includes forming a fin structure, forming a doped amorphous layer over a portion of the fin structure, and performing a knock-on implantation process to drive a dopant from the doped amorphous layer into the portion of the fin structure, thereby forming a doped feature. The doped amorphous layer includes a non-crystalline form of a material of the fin structure. In some implementations, the fin structure includes a crystalline material, and the knock-on implantation process converts at least a portion of the doped amorphous layer into the crystalline material (for example, by crystallizing the portion of the doped amorphous layer), such that the portion of the doped amorphous layer becomes a part of the fin structure. In some implementations, the fin structure includes silicon and the doped amorphous layer includes amorphous silicon, such that the knock-on implantation process crystallizes at least a portion of the amorphous silicon.

In some implementations, the method further includes performing a fin trimming process to reduce a dimension of the fin structure before forming the doped amorphous layer. In some implementations, a thickness of the doped amorphous layer is about equal to a thickness of the fin structure removed during the fin trimming process, and the knock-on implantation process causes the doped amorphous layer to become a part of the fin structure. In some implementations, the knock-on implantation process causes a portion of the doped amorphous layer to become a part of the fin structure. In such implementations, the method further includes oxidizing a remaining portion of the doped amorphous layer and removing the oxidized portion of the doped amorphous layer.

In some implementations, the doped amorphous layer is formed on a source region and a drain region of the fin structure, and the doped feature is a lightly doped source and drain (LDD) region disposed in the source region and the drain region of the fin structure. In some implementations, the method further includes forming a gate structure over a channel region of the fin structure before forming the doped amorphous layer. In some implementations, the knock-on implantation process uses argon ions to drive the dopant from the doped amorphous layer into the portion of the fin structure.

Another exemplary method includes forming a fin structure, forming a doped amorphous silicon layer over a portion of the fin structure, and performing a knock-on implantation process to drive a dopant from the doped amorphous silicon layer into the portion of the fin structure, thereby forming a doped feature. In some implementations, the doped amorphous silicon layer wraps a source region and a drain region of the fin structure, and the doped feature is a lightly doped source and drain (LDD) region disposed in the source region and the drain region. In some implementations, forming the doped amorphous silicon layer includes epitaxially growing a semiconductor material over the portion of the fin structure, wherein the semiconductor material is in situ doped during the epitaxially growing.

In some implementations, the method further includes reducing a width of the fin structure before forming the doped amorphous silicon layer. In such implementations, a thickness of the doped amorphous layer is about equal to an amount of the fin structure removed when reducing the width of the fin structure, and the knock-on implantation process causes the doped amorphous silicon layer to become a part of the fin structure. In some implementations, the knock-on implantation process causes a portion of the doped amorphous silicon layer to become a part of the fin structure. In such implementations, the method further includes oxidizing a remaining portion of the doped amorphous silicon layer, and removing the oxidized portion of the doped amorphous silicon layer.

Yet another exemplary method includes forming a fin structure. The fin structure includes a channel region defined between a source region and a drain region. The fin structure further includes a material having a crystalline structure. The method further includes forming a gate structure over the channel region of the fin structure. The method further includes forming a doped layer over the source region and the drain region of the fin structure. The doped layer includes the material having a non-crystalline structure. The method further includes performing a knock-on implantation process to drive a dopant from the doped layer into the source region and the drain region of the fin structure, wherein the knock-on implantation process converts a portion of the doped layer into the material having the crystalline structure.

In some implementations, the knock-on implantation process forms a lightly doped source and drain (LDD) region, wherein a doped portion of the fin structure and at least a portion of the doped layer form the LDD region. In some implementations, the method further includes performing a fin trimming process to reduce a dimension of the source region and the drain region of the fin structure before forming the doped layer, wherein all of the doped layer becomes a part of the LDD region. In some implementations, the method further includes removing any remaining portion of the doped layer. In some implementations, the fin structure includes silicon and the doped layer includes amorphous silicon, such that the knock-on implantation process crystallizes at least a portion of the amorphous silicon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a fin structure over a substrate;
    forming a gate structure over the fin structure; and
    forming a source/drain feature on the fin structure, wherein forming the source/drain feature includes:
        forming a doped layer on the fin structure; and
        crystallizing at least a portion of the doped layer, wherein crystallizing at least the portion of the doped layer includes performing an implantation process to drive a dopant from the doped layer into the fin structure.

2. The method of claim 1, wherein crystallizing at least a portion of the doped layer includes driving a dopant from the doped layer into a source/drain region of the fin structure.

3. The method of claim 2, wherein the source/drain feature includes the portion of the crystallized doped layer and the source/drain region of the fin structure, and
    wherein a concentration of the dopant is substantially uniform at any point of the portion of the crystallized doped layer and the source/drain region of the fin structure, wherein the dopant concentration is considered substantially uniform when doping concentrations at any defined number of points of the portion of the crystallized doped layer and the source/drain region of the fin structure are within ±5% of each other.

4. The method of claim 3, wherein the concentration of the dopant in the source/drain feature ranges from about $1\times10^{20}$ cm$^{-3}$ to about $5\times10^{20}$ cm$^{-3}$.

5. The method of claim 1, further comprising reducing a width of the fin structure prior to forming the source/drain feature on the fin structure.

6. The method of claim 1, wherein the source/drain feature is a lightly doped source and drain (LDD) feature.

7. The method of claim 1, wherein the doped layer includes silicon.

8. The method of claim 1, wherein performing the implantation process to drive the dopant from the doped layer into the fin structure includes applying a bias voltage of about 1 kV to about 5 kV to the substrate.

9. A method comprising:
    forming a fin structure over a substrate;
    forming a doped layer over the fin structure, wherein the doped layer includes a material having a non-crystalline structure; and
    performing an implantation process to drive a dopant from the doped layer into the fin structure, wherein the implantation process converts a first portion of the doped layer into the material having a crystalline structure.

10. The method of claim 9, wherein performing the implantation process to drive the dopant from the doped layer into the fin structure includes applying a bias voltage of about 1 kV to about 5 kV to the substrate.

11. The method of claim 9, wherein a concentration of the dopant in the fin structure ranges from about $1\times10^{20}$ cm$^{-3}$ to about $5\times10^{20}$ cm$^{-3}$.

12. The method of claim 9, further comprising forming a gate structure over a channel region of the fin structure before performing the implantation process, and
    wherein forming the doped layer over the fin structure includes forming the doped layer over a source/drain region of the fin structure.

13. A method comprising:
    forming a fin structure over a substrate;
    forming a gate structure over the fin structure;
    forming a doped layer over the fin structure, wherein the doped layer has a non-crystalline structure; and
    performing a knock-on implantation process to drive a dopant from the doped layer into the fin structure, wherein the knock-on implantation process converts a portion of the doped layer into a crystalline structure.

14. The method of claim 13, wherein the fin structure includes crystalline silicon germanium and the doped layer includes non-crystalline silicon.

15. The method of claim 13, wherein the doped layer is formed on a source/drain region of the fin structure, and the doped layer forms a heavily doped source/drain (HDD) region disposed in the source region and the drain region of the fin structure.

16. The method of claim 13, wherein a concentration of the dopant in the doped layer ranges from about $1\times10^{21}$ cm$^{-3}$ to about $4\times10^{21}$ cm$^{-3}$ and a concentration of the dopant in the fin structure ranges from about $1\times10^{10}$ cm$^{-3}$ to about $1\times10^{18}$ Cm$^{-3}$.

17. The method of claim 13 further comprising:
    oxidizing a remaining portion of the doped layer after performing the knock-on implantation process; and
    removing the oxidized remaining portion of the doped layer.

18. The method of claim 13 further comprising reducing a width of the fin structure prior to forming the doped layer over the fin structure.

19. The method of claim 18, further comprising reducing a height of the fin structure at a same rate as reducing the width of the fin structure.

20. The method of claim 13 further comprising forming an isolation feature over the substrate prior to forming the doped layer over the fin structure.

\* \* \* \* \*